United States Patent
Nishida

(10) Patent No.: US 10,224,941 B2
(45) Date of Patent: Mar. 5, 2019

(54) OSCILLATION APPARATUS AND OSCILLATION FREQUENCY ADJUSTMENT METHOD

(71) Applicant: Kabushiki Kaisha Toshiba, Minato-Ku, Tokyo (JP)

(72) Inventor: Yukihiro Nishida, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 15/443,765

(22) Filed: Feb. 27, 2017

(65) Prior Publication Data
US 2017/0257103 A1 Sep. 7, 2017

Related U.S. Application Data

(60) Provisional application No. 62/303,565, filed on Mar. 4, 2016.

(51) Int. Cl.
*H03L 7/08* (2006.01)
*H03L 7/085* (2006.01)

(52) U.S. Cl.
CPC .............. *H03L 7/085* (2013.01); *H03L 7/08* (2013.01); *H03L 2207/50* (2013.01)

(58) Field of Classification Search
CPC ............ H03L 1/026; H03L 7/085; H03L 7/08
See application file for complete search history.

(56) References Cited

U.S. PATENT DOCUMENTS

| 5,039,955 | A | * | 8/1991 | Motte | ....................... H03L 7/12 331/10 |
| 7,728,678 | B2 | | 6/2010 | Mitsui | |
| 8,159,306 | B2 | * | 4/2012 | Lin | .................. H03K 19/00369 327/40 |
| 2006/0063502 | A1 | * | 3/2006 | Shibuya | .................... H03L 7/02 455/255 |
| 2010/0321956 | A1 | * | 12/2010 | Yeh | .................... H02M 3/33507 363/16 |

(Continued)

FOREIGN PATENT DOCUMENTS

JP 2005-286667 A 10/2005
JP 2008-301042 A 12/2008

*Primary Examiner* — Jeffrey M Shin
(74) *Attorney, Agent, or Firm* — White & Case LLP

(57) ABSTRACT

An oscillation apparatus includes: an oscillation circuit; a timing control circuit that generates a timing signal using an output clock of the oscillation circuit; an integration circuit that cyclically integrates a reference current based on the timing signal to output an output voltage value; a comparison circuit that compares the output voltage value of the integration circuit with predetermined threshold voltage and outputs a comparison result; a steady voltage changing circuit that, when it is shown by the comparison result of the comparison circuit that the output voltage value of the integration circuit exceeds the threshold voltage, returns the output voltage value of the integration circuit by a predetermined amount; and a frequency adjustment circuit that generates a control signal for adjusting an oscillation frequency of the oscillation circuit based on a value obtained by averaging the comparison result in plurality of the comparison circuit.

13 Claims, 8 Drawing Sheets

(56) References Cited

U.S. PATENT DOCUMENTS

2012/0194227 A1* 8/2012 Lin .................. H02M 1/44
                                                    327/113
2013/0002242 A1* 1/2013 Tsukamoto .......... G01D 5/2448
                                                    324/207.12

* cited by examiner

OSCILLATION APPARATUS AND OSCILLATION FREQUENCY ADJUSTMENT METHOD

CROSS-REFERENCE TO RELATED APPLICATIONS

This application is based upon and claims the benefit of priority from U.S. Provisional Application No. 62/303,565, filed on Mar. 4, 2016, the entire contents of which are incorporated herein by reference.

FIELD

Embodiments described herein relate generally to an oscillation apparatus and an oscillation frequency adjustment method.

BACKGROUND

Conventionally, a frequency of an oscillation circuit is trimmed to a target frequency under particular conditions at shipment and is shipped in a state that the frequency is adjusted. However, characteristics of each of devices constituting the oscillation circuit may fluctuate due to temperature dependence, voltage dependence, aging, external stress and the like, and frequency accuracy of an oscillation frequency of an oscillation circuit output may be deteriorated by being influenced by the fluctuation.

Therefore, conventionally, when high-accuracy oscillation output is required, calibration is performed by counting oscillation circuit clocks with a low-speed oscillation clock, an external pulse such as a communication pulse, or the like used as a reference clock. By using such a reference clock for calibration, it is possible to obtain high frequency accuracy. However, there may be a case where the reference clock for calibration cannot be used.

Therefore, an apparatus which performs frequency adjustment without using the reference clock for calibration is examined. For example, a method is conceivable in which an oscillation frequency is adjusted by generating a pulse with a sufficient width, counting the number of output clocks of an oscillation circuit during a period of occurrence of the pulse and estimating the oscillation frequency based on the pulse width and a count value.

Especially in a case of configuring an oscillation circuit on a semiconductor apparatus, it is possible to construct a system which is advantageous for integration by controlling an oscillation frequency without using a reference clock by a crystal vibrator or the like.

In conventional methods for adjusting an oscillation frequency, however, there is a problem that power consumption relatively increases, and it is difficult to secure accuracy due to a factor of fluctuation in each characteristic so that it is not possible to perform high-accuracy oscillation frequency control.

DETAILED DESCRIPTION

An oscillation apparatus of embodiments includes: an oscillation circuit; a timing control circuit configured to generate a timing signal using an output clock of the oscillation circuit; an integration circuit configured to cyclically integrate a reference current based on the timing signal to output an output voltage value; a comparison circuit configured to compare the output voltage value of the integration circuit with predetermined threshold voltage and output a comparison result; a steady voltage changing circuit configured to, when it is shown by the comparison result of the comparison circuit that the output voltage value of the integration circuit exceeds the threshold voltage, return the output voltage value of the integration circuit by a predetermined amount; and a frequency adjustment circuit configured to generate a control signal for adjusting an oscillation frequency of the oscillation circuit based on a value obtained by averaging the comparison result in plurality of the comparison circuit.

The embodiments will be described below in detail with reference to drawings.

(First Embodiment)

Figure 1:
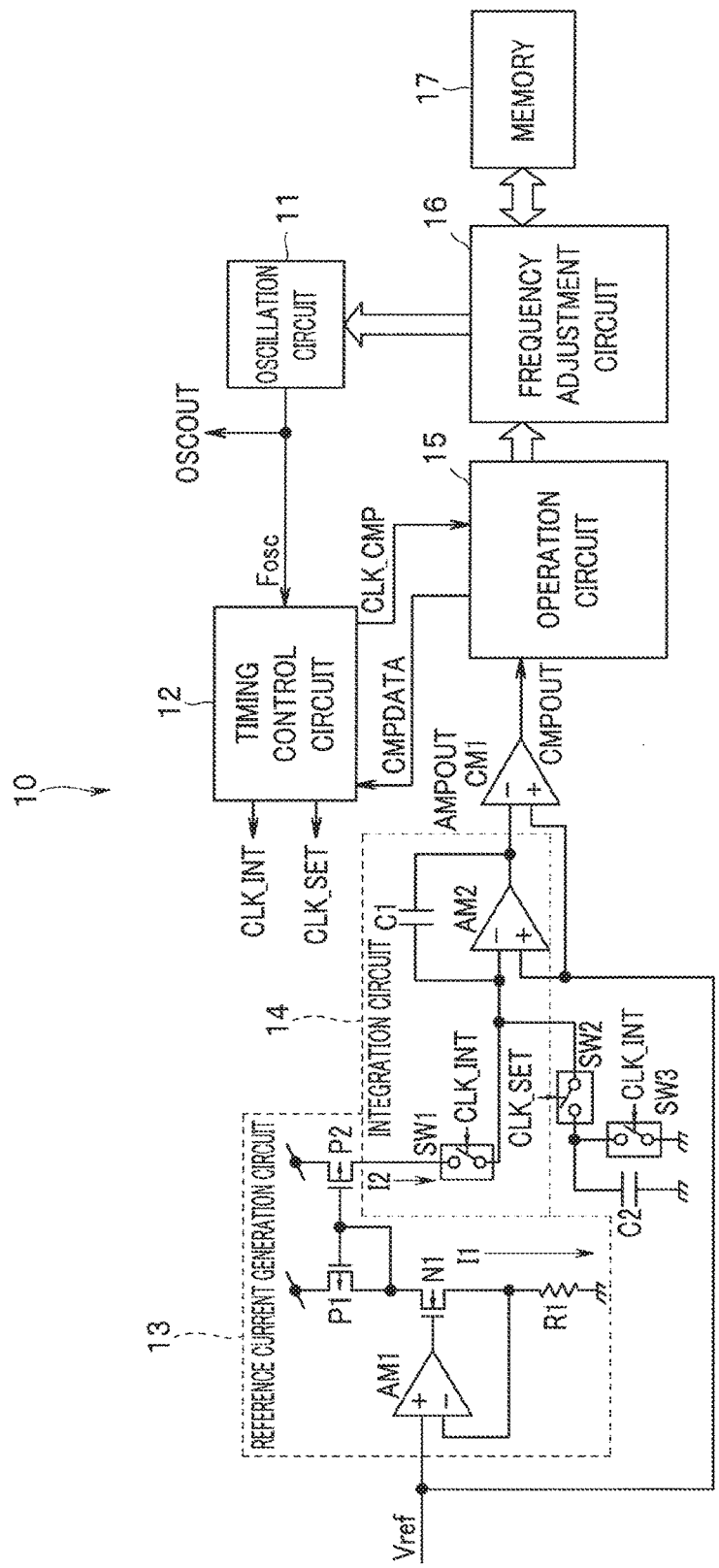
FIG. 1 is a circuit diagram showing an oscillation apparatus according to a first embodiment.

FIG. 1 is a circuit diagram showing an oscillation apparatus according to a first embodiment. The apparatus of FIG. 1 automatically adjusts an oscillation frequency of an oscillation circuit to obtain high-accuracy oscillation frequency output. As the oscillation circuit, an oscillation circuit in any configuration may be adopted if the oscillation circuit is capable of frequency adjustment.

In the embodiment, in order to detect oscillation frequency deviation, a first voltage value corresponding to a clock frequency is caused to be generated by integration during a period corresponding to an oscillation cycle (a clock cycle) of oscillation output. That is, in the embodiment, integration is required to be performed only during the period corresponding to the oscillation cycle, and, therefore, it is possible to use an element with a relatively small capacity value. Further, since a quantity of a current flowing through the circuit is relatively small, power saving can be realized. In the embodiment, adjustment of an oscillation frequency is performed by performing comparison using a ratio of the first voltage value to a second voltage value not depending on time, comparing a result of the comparison with a comparison result in a case where correct oscillation output is obtained, and, thereby, determining oscillation frequency deviation.

In FIG. 1, an oscillation circuit 11 oscillates at a predetermined oscillation frequency and generates oscillation output OSCOUT. Further, the oscillation circuit 11 outputs an oscillation clock Fosc corresponding to the oscillation output OSCOUT to a timing control circuit 12 for adjustment of the oscillation frequency. Note that the example of FIG. 1 shows an example in which the oscillation circuit 11 gives the oscillation output OSCOUT as it is, to the timing control circuit 12 as the oscillation clock Fosc.

The timing control circuit 12 divides the inputted oscillation clock Fosc by N and generates a clock CLK_INT which is synchronized with a clock Fosc/N obtained by the division and a pulse width of which is same as that of the clock Fosc/N in a predetermined cycle. Further, the timing control circuit 12 generates a comparison clock CLK_CMP in a cycle corresponding to the clock CLK_INT. Further, the timing control circuit 12 generates a clock CLK_SET synchronized with the clock Fosc/N, based on a sampling result CMPDATA corresponding to comparison results CMPOUT to be described later, which occurs in response to the comparison clock CLK_CMP.

An oscillation apparatus 10 is provided with a reference current generation circuit 13. The reference current generation circuit 13 supplies a reference current I2 to an integration circuit 14. For example, the reference current generation circuit 13 has a source-drain path of a PMOS transistor P1, a drain-source path of an NMOS transistor N1 and a resistance R1, which are connected in series between a power source terminal and a reference potential point (for example, 0 V). Further, the reference current generation circuit 13 is provided with a source-drain path of a PMOS transistor P2 between the power source terminal and an input terminal of the integration circuit 14. Gates of the transistors P1 and P2 are commonly connected.

Further, the reference current generation circuit 13 is provided with an amplifier AM1. Reference voltage Vref is supplied to a non-inverting input terminal of the amplifier AM1, and an inverting input terminal is connected to a source of the transistor N1. An output terminal of the amplifier AM1 is connected to a gate of the transistor N1. In the reference current generation circuit 13, a mirror current I2 of a current I1 flows through the source-drain path of the transistor P2 when a current flowing through the resistance R1 is indicated as a current I1, and the mirror current (a constant current) can be supplied to the integration circuit 14 as the reference current I2.

The integration circuit 14 is configured with a switch SW1, an amplifier AM2 and a capacitor C1. Further, a steady voltage changing circuit configured with switches SW2 and SW3 and a capacitor C2 is connected to an inverting input terminal of the amplifier AM2 constituting the integration circuit 14.

The switches SW1 and SW3 are on/off-controlled by the clock CLK_INT, and the switch SW2 is on/off-controlled by the clock CLK_SET. For example, the switches SW1 and SW3 are turned on by a high level (hereinafter referred to as an H level) of the clock CLK_INT and turned off by a low level (hereinafter referred to as an L level). Further, the switch SW2 is turned on by an H level of the clock CLK_SET and turned off by an L level.

When being turned on, the switch SW1 gives the reference current I2 from the reference current generation circuit 13 to the inverting input terminal of the amplifier AM2. The switch SW2 and the capacitor C2 as the steady voltage changing circuit are connected in series between the inverting input terminal of the amplifier AM2 and the reference potential point, and the switch SW3 is connected to the capacitor C2 in parallel. The capacitor C1 is connected between the inverting input terminal and an output terminal of the amplifier AM2, and the reference voltage Vref is supplied to the non-inverting input terminal of the amplifier AM2.

By the switch SW1 being turned on, the reference current I2 from the reference current generation circuit 13 flows into the integration circuit 14, and the capacitor C1 is charged. Then, terminal voltage of the capacitor C1 increases, and a voltage value of an output terminal of the integration circuit 14, which is the output terminal of the amplifier AM2, linearly decreases. The switch SW1 is turned on only during an H level period of the clock CLK_INT. That is, the reference current I2 is integrated during a pulse period of the clock CLK_INT based on an oscillation cycle of the oscillation circuit 11, and the voltage value of the output terminal of the integration circuit 14 changes by an amount of change corresponding to the oscillation cycle.

Further, by the switch SW2 being turned on during an off period of the switch SW1, an electric charge held by the capacitor C1 flows to the capacitor C2 via the switch SW2, and the capacitor C2 is charged. Note that the switch SW3 is turned on before the switch SW2 is turned on, and the switch SW3 causes the capacitor C2 to discharge electricity and to be initialized. Note that the switch SW3 is only required to be turned on before the capacitor C2 is charged, and may be controlled by a control signal other than the clock CLK_INT.

That is, in the integration circuit 14, output voltage linearly decreases during the H level period of the clock CLK_INT and, when an H level period of the clock CLK_SET starts, increases by a predetermined amount of voltage without depending on time.

Now, falling voltage at the output terminal of the amplifier AM2 during the pulse period (the H level period) of the clock CLK_INT is denoted by Vdown; a capacity of the capacitor C1 is denoted by C1, and a charged electric charge is denoted by Q1. Further, rising voltage at the output terminal of the amplifier AM2 at time of transition to the H level period of the clock CLK_SET is denoted by Vup; a capacity of the capacitor C2 is denoted by C2, and a charged electric charge is denoted by Q2. Further, a resistance value of the resistance R1 is denoted by R1; a pulse width of the clock CLK_INT is denoted by Tw; and a current amount of the reference current I2 is denoted by I2. In the integration circuit 14 of FIG. 1, the falling voltage Vdown and the rising voltage Vup can be represented by following equations (1) and (2):

$$\text{Vdown} = Q1/C1 = (I2 \times Tw)/C1 = \{(\text{Vref}/R1) \times Tw\}/C1 = (\text{Vref} \times Tw)/(C1 \times R1) \quad (1)$$

$$\text{Vup} = Q2/C1 = (C2 \times \text{Vref})/C1 \quad (2)$$

Therefore, a ratio of the falling voltage Vdown to the rising voltage Vup can be shown by a following equation (3):

$$(\text{Vref} \times Tw)/(C1 \times R1) : (C2 \times \text{Vref})/C1 = Tw/R1 : C2 \quad (3)$$

The equation (3) shows that, if the resistance R1 and the capacitor C2 are constant values, the ratio of the falling voltage Vdown to the rising voltage Vup is in proportion to the pulse width Tw, and that, if the pulse width Tw is a constant value, the ratio of the falling voltage Vdown to the rising voltage Vup is a predetermined constant value. That is, the pulse width Tw corresponds to an oscillation output cycle of the oscillation circuit 11; and, when the oscillation frequency fluctuates and the pulse width Tw changes, the ratio of the falling voltage Vdown to the rising voltage Vup also changes. Therefore, by controlling the oscillation frequency of the oscillation circuit 11 so that the ratio of the falling voltage Vdown to the rising voltage Vup is the predetermined constant value, stable oscillation output with a desired frequency can be obtained.

In the embodiment, in order to determine the ratio of the falling voltage Vdown to the rising voltage Vup with a high accuracy, a comparator CM1 configured to compare output of the integration circuit 14 with predetermined reference voltage is adopted so that, by performing sampling of comparison results of the comparator CM1 and determining sampling results, a moving average value of the determined sampling results is obtained. The oscillation frequency of the oscillation circuit 11 is adjusted in accordance with the moving average value.

That is, output AMPOUT of the integration circuit 14 is supplied to an inverting input terminal of the comparator CM1. The reference voltage Vref is supplied to a non-inverting input terminal of the comparator CM1 as threshold voltage, and the comparator CM1 compares the output AMPOUT with the reference voltage Vref and outputs a comparison result CMPOUT of an H level (a logical value "1") or an L level (a logical value "0"). Note that the comparator CM1 may compare the output AMPOUT of the integration circuit 14 with arbitrary threshold voltage other than the reference voltage Vref.

Comparison results CMPOUT of the comparator CM1 as a comparison circuit are supplied to an operation circuit 15. The operation circuit 15 performs sampling of the comparison results CMPOUT at timings of the clock CLK_CMP from the timing control circuit 12, determines a moving average value of sampling results and outputs the moving average value to a frequency adjustment circuit 16. For example, the operation circuit 15 may determine a sum total of logical values of the sampling results as the moving average value.

A reference value based on an oscillation frequency f0 expected as output of the oscillation circuit 11 is stored in a memory 17. As the reference value, a same value as a moving average value obtained by the operation circuit 15 in a case where a clock CLK_INT with a pulse width Tw0 occurs correspondingly to the oscillation frequency f0 is stored. Note that the reference value can be determined by operation based on the above equation (3). The frequency adjustment circuit 16 is adapted to compare a moving average value from the operation circuit 15 with the reference value stored in the memory 17 and control the oscillation frequency of the oscillation circuit 11 so that a comparison result is 0. For example, if the oscillation frequency becomes lower than the oscillation frequency f0, the pulse width Tw becomes larger than the pulse width Tw0, a ratio with the falling voltage Vdown when the rising voltage Vup is used as a reference increases, and, for example, the moving average value becomes smaller than the reference value, then the frequency adjustment circuit 16 performs control so as to increase the oscillation frequency of the oscillation circuit 11. On the contrary, if the oscillation frequency becomes higher than the oscillation frequency f0, the pulse width Tw becomes smaller than the pulse width Tw0, the ratio with the falling voltage Vdown when the rising voltage Vup is used as a reference decreases, and, for example, the moving average value becomes larger than the reference value, then the frequency adjustment circuit 16 performs control so as to decrease the oscillation frequency of the oscillation circuit 11.

Figure 2:
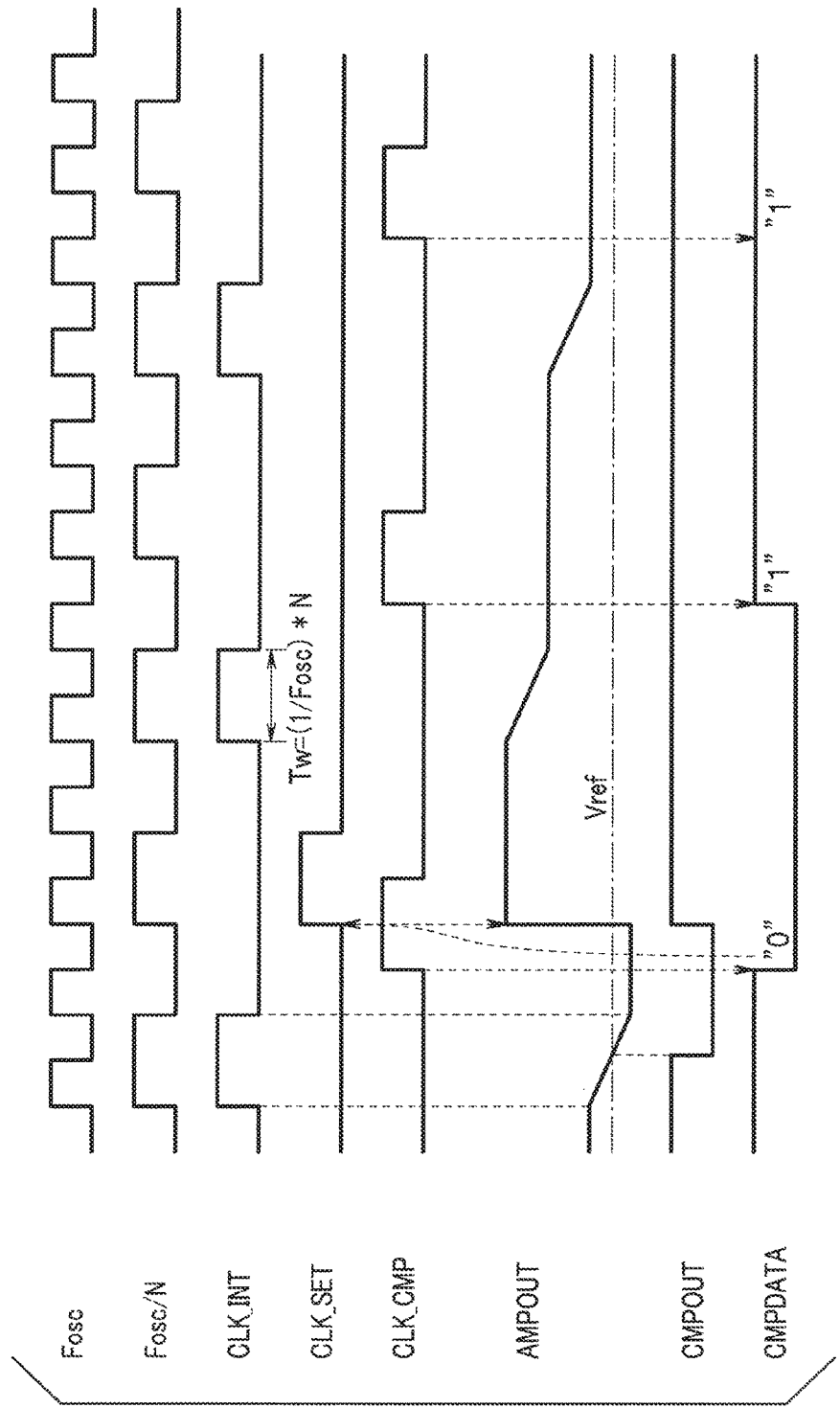
FIG. 2 is a timing chart for illustrating an operation of the first embodiment.
Figure 3:
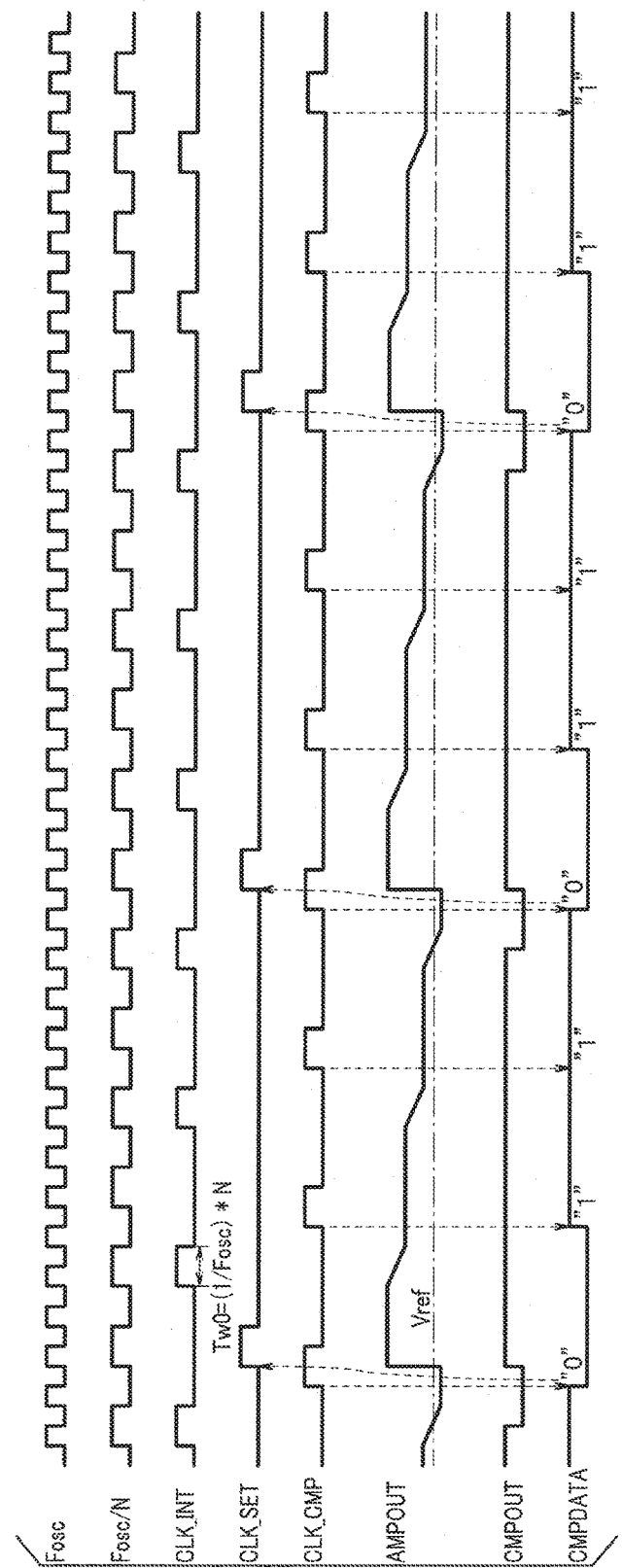
FIG. 3 is a timing chart for illustrating an operation of the first embodiment.
Figure 4:
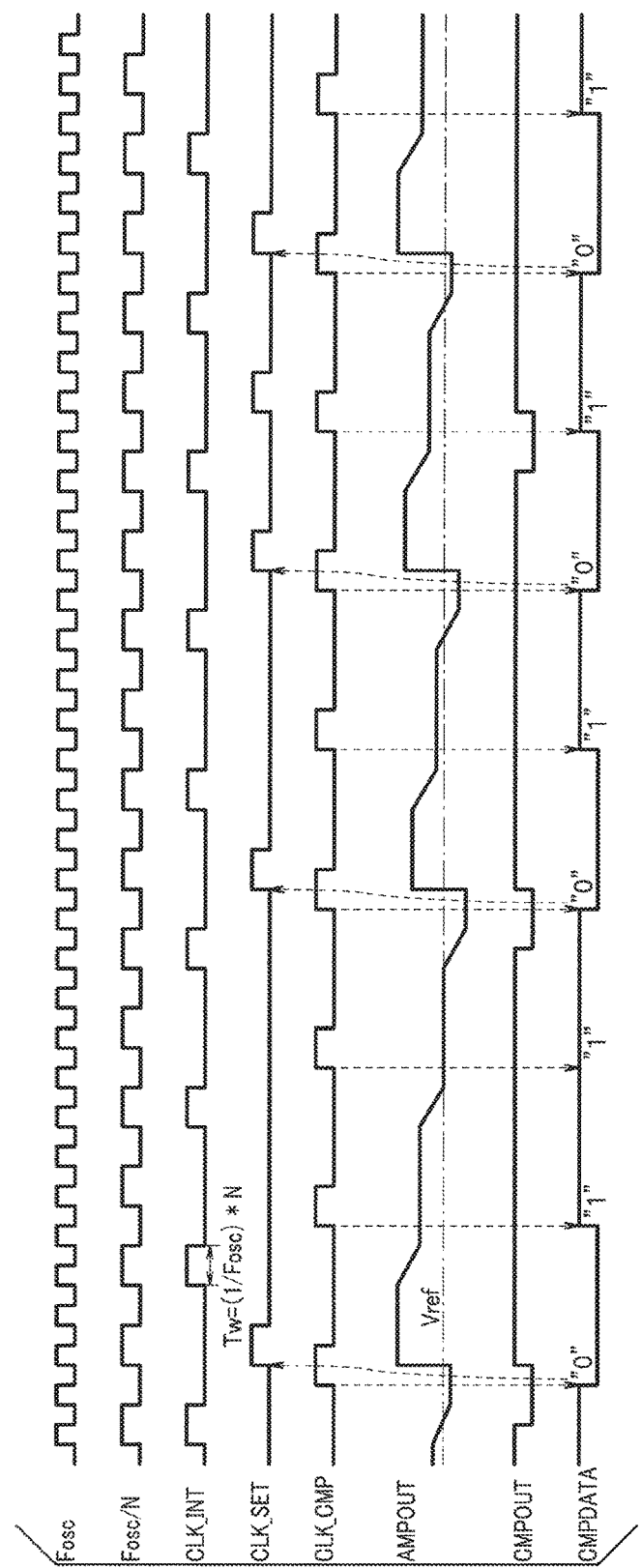
FIG. 4 is a timing chart for illustrating an operation of the first embodiment.

Next, operations of the embodiment configured as above will be described with reference to FIGS. 2 to 4. FIGS. 2 to 4 are timing charts for illustrating the operations of the first embodiment. A first row in FIG. 2 shows the oscillation clock Fosc; a second row shows the oscillation clock Fosc/N obtained by dividing the oscillation clock Fosc by N; a third row shows the clock CLK_INT; a fourth row shows the clock CLK_SET; a fifth row shows the clock CLK_CMP; a sixth row shows the output AMPOUT of the amplifier AM2; a seventh row shows the comparison results CMPOUT; and an eighth row shows the sampling results CMPDATA.

The oscillation output OSCOUT of the oscillation circuit 11 is given to the timing control circuit 12 as the oscillation clock Fosc to be a timing generation source. The timing control circuit 12 divides the oscillation clock Fosc by N to generate the oscillation clock Fosc/N with a frequency of Fosc/N, and generates the clock CLK_INT with a pulse width of Tw which occurs in a predetermined cycle, in synchronization with the clock Fosc/N. When a frequency of the oscillation clock Fosc is denoted by Fosc, the pulse width Tw of the clock CLK_INT is represented by (1/Fosc)× N, which corresponds to an oscillation frequency of the oscillation output OSCOUT.

The reference current generation circuit 13 generates the reference current I2 and supplies the reference current I2 to the integration circuit 14. The switch SW1 is turned on during the pulse period (the H level period) of the clock CLK_INT, and the reference current I2 flows into the integration circuit 14. Thereby, the output AMPOUT of the integration circuit 14 linearly decreases at a predetermined inclination as shown in FIG. 2. The output AMPOUT of the integration circuit 14 is compared with the reference voltage Vref in the comparator CM1. In the comparator CM1, when the output AMPOUT decreases lower than the reference voltage Vref, the comparison result CMPOUT changes to the L level as shown in FIG. 2; and, when the output AMPOUT exceeds the reference voltage Vref, the comparison result CMPOUT changes to the H level.

Output CMPOUT of the comparator CM1 is supplied to the operation circuit 15, and the operation circuit 15 performs sampling of the comparison results of the comparator CM1 at a timing of a rising edge of the clock CLK_CMP and outputs a sampling result to the timing control circuit 12 as a sampling result CMPDATA.

When a sampling result CMPDATA of "0" is inputted, the timing control circuit 12 generates the clock CLK_SET in synchronization with the clock Fosc/N. When the switch SW2 is turned on during the H level period of the clock CLK_SET, the integration circuit 14 causes the output AMPOUT of the integration circuit 14 to increase by a prescribed voltage shown by the above equation (2). Note that the clock CLK_INT and the clock CLK_SET are controlled so that the clock CLK_INT and the clock CLK_SET are simultaneously at the H level.

A similar operation is repeated after that. The operation circuit 15 determines a moving average value of sampling results CMPDATA and outputs the determined moving average value to the frequency adjustment circuit 16. The number of times of sampling corresponds to the number of times at which the falling voltage Vdown occurs, and the number of times at which the sampling result CMPDATA of "0" occurs corresponds to the number of times at which the rising voltage Vup occurs. Each time the output AMPOUT of the integration circuit 14 decreases lower than the reference voltage Vref, the rising voltage Vup is caused to occur. When a sufficiently long period is set, a rate of occurrence of the sampling result CMPDATA of "0" during the period corresponds to the ratio of the falling voltage Vdown to the rising voltage Vup. That is, a moving average value of sampling results CMPDATA during a sufficiently long period corresponds to the pulse width Tw.

In the memory 17, a moving average value obtained by the operation circuit 15 in a case where the oscillation circuit 11 oscillates at the expected oscillation frequency f0 is determined in advance and stored as a reference value. By comparing a moving average value from the operation circuit 15 with the reference value, the frequency adjustment circuit 16 generates a control signal for adjusting the oscillation frequency of the oscillation circuit 11 and supplies the control signal to the oscillation circuit 11. Thereby, the oscillation output of the oscillation circuit 11 changes so that the moving average value from the operation circuit 15 corresponds to the reference value stored in the memory 17. Thus, it is possible to adjust output of the oscillation circuit 11 to the expected oscillation frequency F0 with a high accuracy.

FIGS. 3 and 4 are timing charts written in a same description pattern as that of FIG. 2, and show operations in a case where the ratio of the falling voltage Vdown to the rising voltage Vup is assumed to be 1:3. FIG. 3 shows an example in a case where the oscillation circuit 11 oscillates at the expected oscillation frequency f0; and FIG. 4 shows an example in a case where the oscillation circuit 11 oscillates at a frequency lower than the expected oscillation frequency f0.

In the example of FIG. 3, sampling results CMPDATA in which a pattern of "0", "1" and "1" is repeated are obtained by the operation circuit 15. For example, it is assumed that a moving average value is determined at a ninth cycle of the clock CLK_CMP. Note that, actually, it is better to set a sufficiently long period to determine a moving average value. A sum total of the sampling results CMPDATA at the ninth cycle of the clock CLK_CMP is 6. In comparison, in the example of FIG. 4, sampling results CMPDATA of "0", "1", "1", "0", "1", "0", "1", . . . are obtained by the operation circuit 15. For example, a sum total of the sampling results CMPDATA at the ninth cycle of the clock CLK_CMP is 5. In this case, when, for example, 6 is stored in the memory 17 as a reference value, the frequency adjustment circuit 16 outputs a control signal for increasing the oscillation frequency of the oscillation circuit 11, to the oscillation circuit 11 because the sum total 5, which is the moving average value of the sampling results CMPDATA, is smaller than the reference value 6. Thus, in the case of the example of FIG. 4, the oscillation circuit 11 is controlled to increase the oscillation frequency, and, as a result, the oscillation circuit 11 changes into the state of FIG. 3.

As described above, in the embodiment, by causing a first voltage value corresponding to a clock cycle to be generated by integration during a period corresponding to an oscillation cycle (the clock cycle) of an oscillation output, performing comparison using a ratio of the first voltage value and a second voltage value not depending on time, determining a moving average value of sampling results of comparison results, and comparing the moving average value with a moving average value in a case where correct oscillation output is obtained, an oscillation frequency deviation is determined so that adjustment of the oscillation frequency is performed. Thereby, it is possible to automatically adjust the oscillation frequency and obtain high-accuracy oscillation output, without inputting a pulse or the like from outside. Therefore, it is possible to construct a system which is advantageous for integrated circuitization. Further, reference current integration is required to be performed only during the period corresponding to the oscillation cycle, and, therefore, it is possible to use an element with a relatively small capacity value as a capacity used for the integration. Further, since a quantity of a current flowing through the circuit is relatively small, power saving can be realized. Further, comparison between the first voltage value and the second voltage value is performed for each predetermined period, and oscillation frequency deviation is determined from a moving average value of sampling results. By setting a sufficiently long period as a period for determining the moving average value, it is possible to detect a frequency error with a high accuracy and obtain high-accuracy oscillation output. Further, the oscillation frequency deviation is determined by a moving average of sampling results, and it is possible to reduce influence of noise and configure a self-adjustment type oscillation circuit which can sufficiently suppress fluctuation in the oscillation frequency.

(Second Embodiment)

Figure 5:
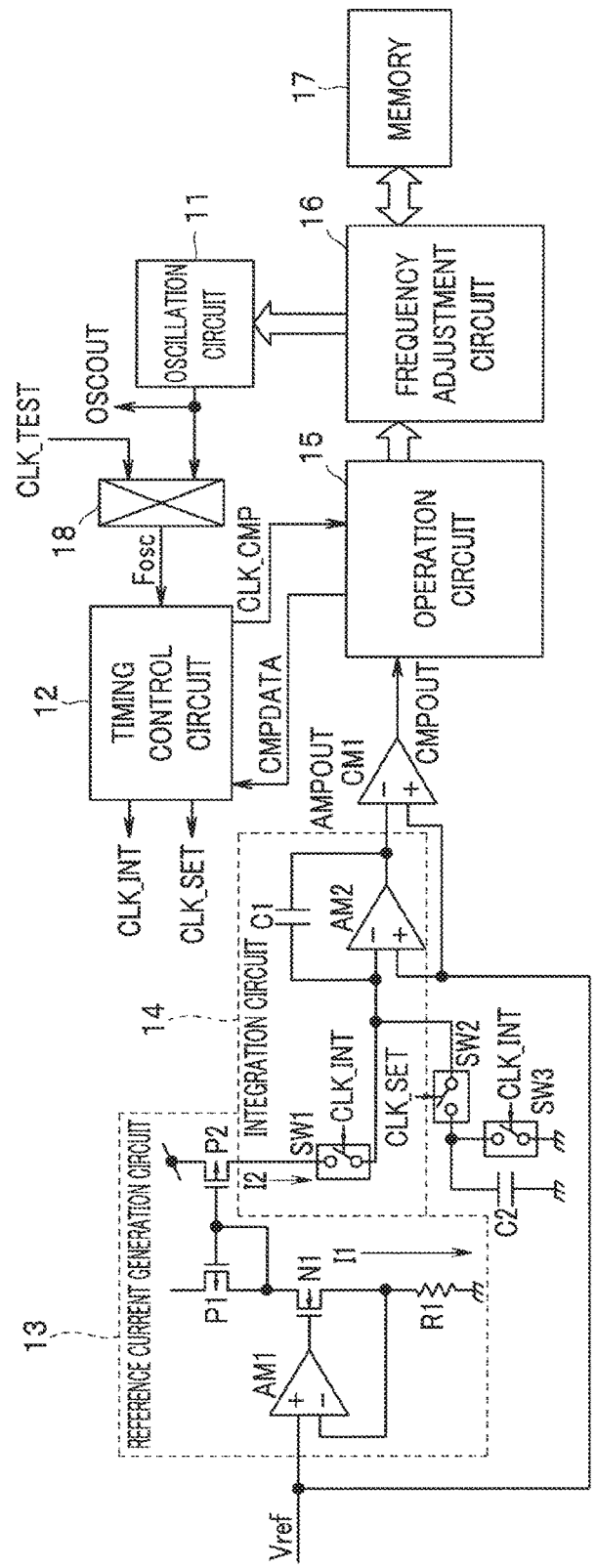
FIG. 5 is a block diagram showing a second embodiment.

FIG. 5 is a block diagram showing a second embodiment. In FIG. 5, same components as in FIG. 1 are given same reference numerals, and description of the components will be omitted. In the first embodiment, it is described that the ratio of the falling voltage Vdown to the rising voltage Vup of the integration circuit 14 changes only by the pulse width Tw of the clock CLK_INT, based on the above equation (3). Actually, however, the resistance value R1 and the capacity C2 are different for each product because of manufacturing variation of the resistance R1 and the capacitor C2, and, therefore, it is not possible to determine an accurate reference value in advance by calculation and cause the reference value to be stored into the memory 17. Therefore, in the embodiment, an accurate test signal with a known frequency is inputted at time of shipment or the like, and a moving average value in a case of using the test signal is determined and stored into the memory 17 as a reference value.

In the embodiment, a selector 18 configured to switch between the oscillation output OSCOUT from the oscillation circuit 11 and a test signal CLK_TEST is provided. Further, in the memory 17, a moving average value obtained by the operation circuit 15 when the selector 18 selects the test signal CLK_TEST and gives the test signal CLK_TEST to the timing control circuit 12 is stored.

In the embodiment configured as described above, the selector 18 selects the test signal CLK_TEST and gives the test signal CLK_TEST to the timing control circuit 12 at the time of shipment or the like. The test signal CLK_TEST is a signal with a same accurate oscillation frequency as an expected oscillation frequency.

When a clock Fosc/N based on the test signal CLK_TEST is what is shown in FIG. 3, an operation similar to the operation shown in FIG. 3 is performed, and sampling results CMPDATA obtained by the operation circuit 15 is what is shown in FIG. 3. The operation circuit 15 determines a moving average value based on the sampling results CMPDATA. The moving average value is given to the memory 17 and stored as a reference value.

In actual use, the selector 18 selects the oscillation output OSCOUT and outputs the oscillation output OSCOUT to the timing control circuit 12.

Other operations are similar to those of the first embodiment.

Thus, in the embodiment, effects similar to those of the first embodiment are obtained. Furthermore, in the embodiment, it is possible to certainly detect an oscillation frequency error and obtain high-accuracy oscillation output irrespective of variation of elements.

(Third Embodiment)

Figure 6:
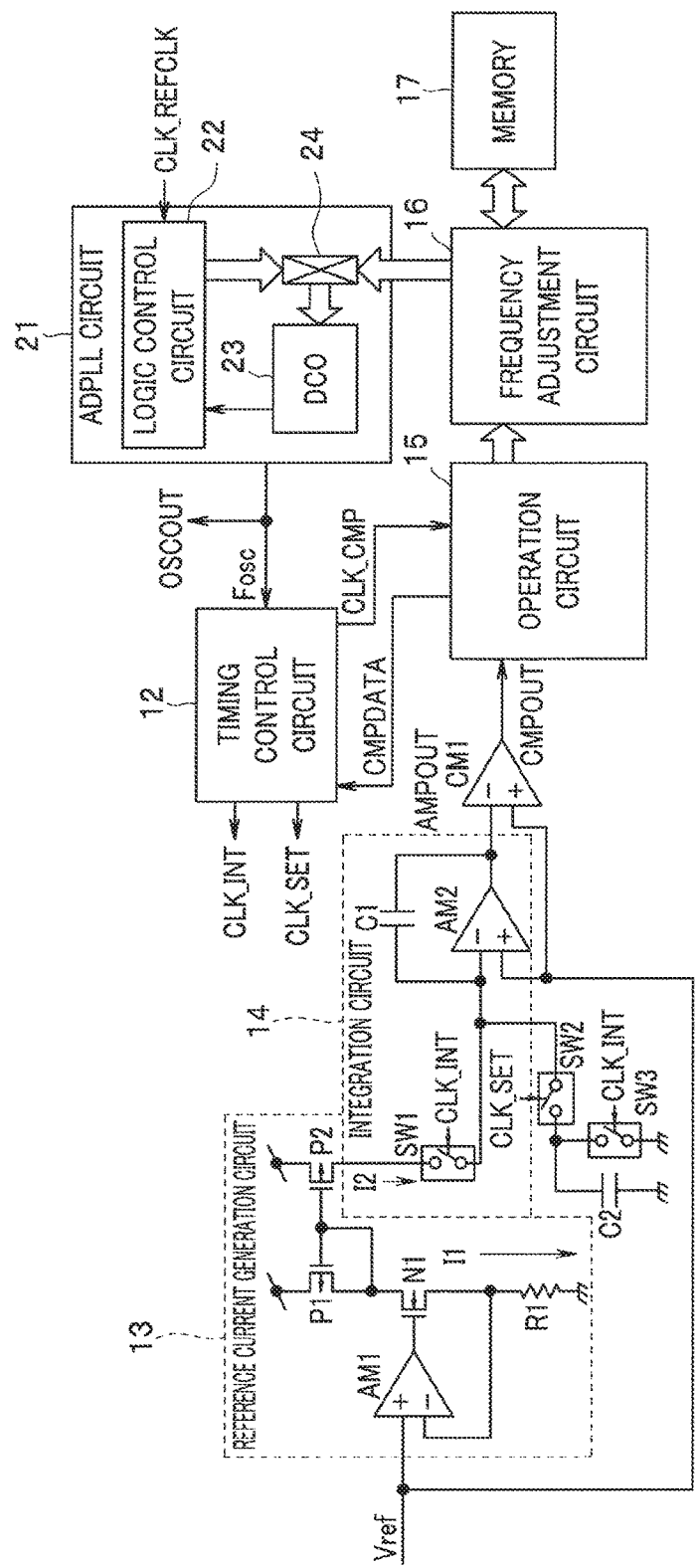
FIG. 6 is a block diagram showing a third embodiment.

FIG. 6 is a block diagram showing a third embodiment. In FIG. 6, same components as in FIG. 5 are given same reference numerals, and description of the components will be omitted. In the embodiment, an example in which an ADPLL (all-digital phase-locked loop) circuit is adopted as an oscillation circuit is shown.

An ADPLL circuit 21 has a logic control circuit 22, a DCO (digital control oscillator) 23 and a selector 24. The DCO 23 is adapted to generate and output the oscillation output OSCOUT with an oscillation frequency corresponding to an inputted digital value. The logic control circuit 22 determines a phase difference between oscillation output of the DCO 23 and a reference clock CLK_REFCLK inputted from outside, generates a digital value for causing the phase difference to be 0 and outputs the digital value to the DCO 23 via the selector 24. An oscillation frequency of the DCO 23 is controlled by the inputted digital value. Thereby, the ADPLL circuit 21 can generate high-speed oscillation output OSCOUT synchronized with the reference clock CLK_REFCLK, with a frequency obtained by frequency-multiplying a reference clock frequency.

By utilizing output of an oscillation circuit an oscillation frequency of which is controlled with a high accuracy, such as a crystal oscillator, as the reference clock CLK_REFCLK, the ADPLL circuit 21 can generate high-accuracy and high-speed oscillation output OSCOUT. In a case of mounting an ADPLL circuit on a semiconductor apparatus or the like, however, it is conceivable to use relatively low-accuracy oscillation output of a built-in oscillation circuit configured on the semiconductor apparatus as a reference clock, instead of the high-accuracy reference clock CLK_REFCLK. There may be a case where a selector not shown is provided to perform such switching between reference clocks.

In the embodiment, instead of giving oscillation output of such a built-in oscillation circuit configured on a semiconductor apparatus to the ADPLL circuit 21 as the reference clock CLK_REFCLK, the DCO 23 in the ADPLL circuit 21 is used also as a frequency-adjustable oscillation circuit to directly generate high-accuracy and high-speed oscillation output OSCOUT. In this case, the selector 24 supplies a digital value from the logic control circuit 22 to the DCO 23 and gives a control signal from the frequency adjustment circuit 16 to the DCO 23. Oscillation output of the DCO 23 is controlled based on the control signal.

Note that, in this case also, by storing a moving average value obtained by the operation circuit 15 into the memory 17 when the high-accuracy reference clock CLK_REFCLK is supplied to the logic control circuit 22, it is possible to cause high-accuracy and high-speed oscillation output similar to the high-accuracy reference clock CLK_REFCLK to be generated from the DCO 23 even if the reference clock CLK_REFCLK from outside is not inputted.

In the embodiment configured as described above, a reference value for obtaining an expected oscillation frequency as the oscillation output OSCOUT is stored into the memory 17 first. For example, a high-accuracy reference clock CLK_REFCLK by a crystal oscillator or the like is given to the logic control circuit 22 to cause the ADPLL circuit 21 to operate. Thereby, the DCO 23 outputs high-accuracy and high-speed oscillation output OSCOUT. In this case, the operation circuit 15 obtains a moving average value for obtaining the high-accuracy and high-speed oscillation output OSCOUT. The moving average value can be stored into the memory 17 as a reference value.

After that, the frequency adjustment circuit 16 compares a moving average value from the operation circuit 15 with the reference value from the memory 17, and generates and outputs a control signal so that the moving average value corresponds to the reference value. The control signal is supplied to the DCO 23 via the selector 24, and the oscillation output of the DCO 23 is controlled in response to the control signal. Thereby, when output of the DCO 23 is going to fluctuate, a control signal for adjusting the output of the DCO 23 to expected oscillation output OSCOUT is outputted from the frequency adjustment circuit 16, and the DCO 23 can stably output high-accuracy and high-speed oscillation output OSCOUT.

As described above, in the embodiment, by using a DCO in an ADPLL circuit as a frequency-adjustable oscillation circuit, without providing a built-in oscillation circuit configured to generate a reference clock used for the ADPLL circuit, it is possible obtain high-accuracy and high-speed oscillation output. It is not necessary to provide a built-in oscillation circuit for a PLL circuit on a semiconductor apparatus, and, therefore, it is possible to reduce a size of the semiconductor apparatus. Further, there is also an advantage that current consumption for driving the built-in oscillation circuit can be reduced.

(Fourth Embodiment)

Figure 7:
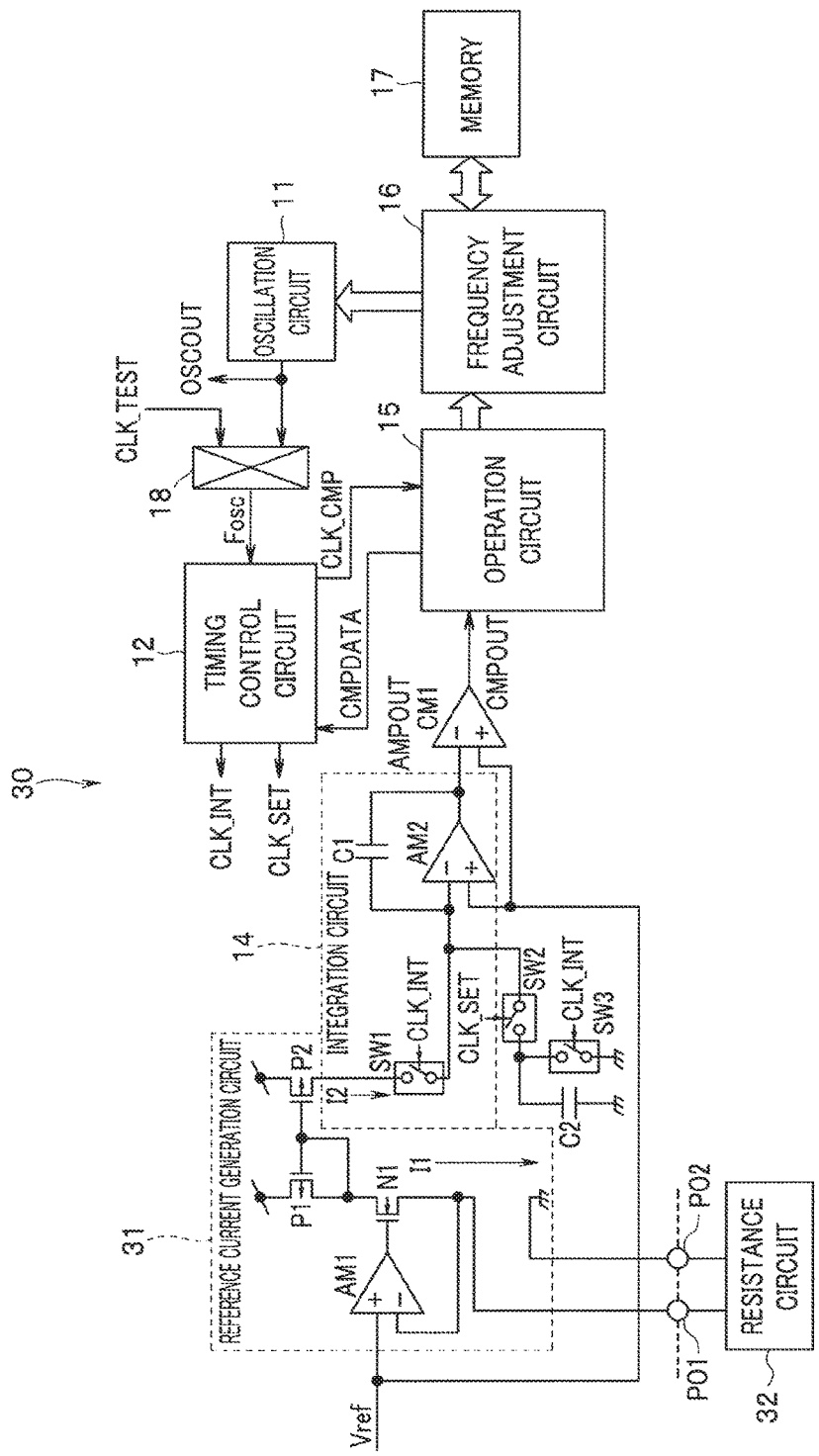
FIG. 7 is a block diagram showing a fourth embodiment.

FIG. 7 is a block diagram showing a fourth embodiment. In FIG. 7, same components as in FIG. 5 are given same reference numerals, and description of the components will be omitted. An oscillation apparatus 30 in the embodiment adopts a reference current generation circuit 31 instead of the reference current generation circuit 13. The reference current generation circuit 31 is such that a resistance configured to determine a reference current value is an external part.

The source of the transistor N1 is connected to an external resistance connection terminal PO1 of the oscillation apparatus 30, and an external resistance connection terminal PO2 is connected to the reference potential point. A predetermined resistance is connected between the connection terminals PO1 and PO2 by a resistance circuit 32. The resistance circuit 32 can connect a resistance selected by a user between the connection terminals PO1 and PO2.

The embodiment configured as described above is different from each of the above embodiments only in a point that the reference current I2 generated by the reference current generation circuit 31 is determined by the resistance connected between the connection terminals PO1 and PO2.

For example, the user can connect a resistance corresponding to oscillation accuracy required for each product, between the connection terminals PO1 and PO2 by the resistance circuit 32. For example, if a high-accuracy clock is required, accuracy of oscillation output can be improved by connecting and using a high-accuracy resistance between the connection terminals PO1 and PO2.

Other operations and effects are similar to those of each of the above embodiments. Further, in the embodiment, by causing a resistance element to be an external part, the accuracy of oscillation output can be freely set. Further, when a frequency-adjustable oscillation circuit is free running, the resistance connection terminals PO1 and PO2 can be used as I/O ports (equivalent to an I/O port pulled-down by a high resistance), and, therefore, especially in a so-called small pin product with a relatively small number of pins, there is an advantage that a degree of freedom is improved. For example, it is also possible to, during a normal time period, cause the oscillation circuit 11 to operate in free run at a value set so as to output a target frequency in advance and use the connection terminals PO1 and PO2 as I/O ports, and, when it is desired to confirm frequency accuracy or periodically, perform control to check frequency fluctuation by connecting a resistance to the connection terminals PO1 and PO2.

(Fifth Embodiment)

Figure 8:
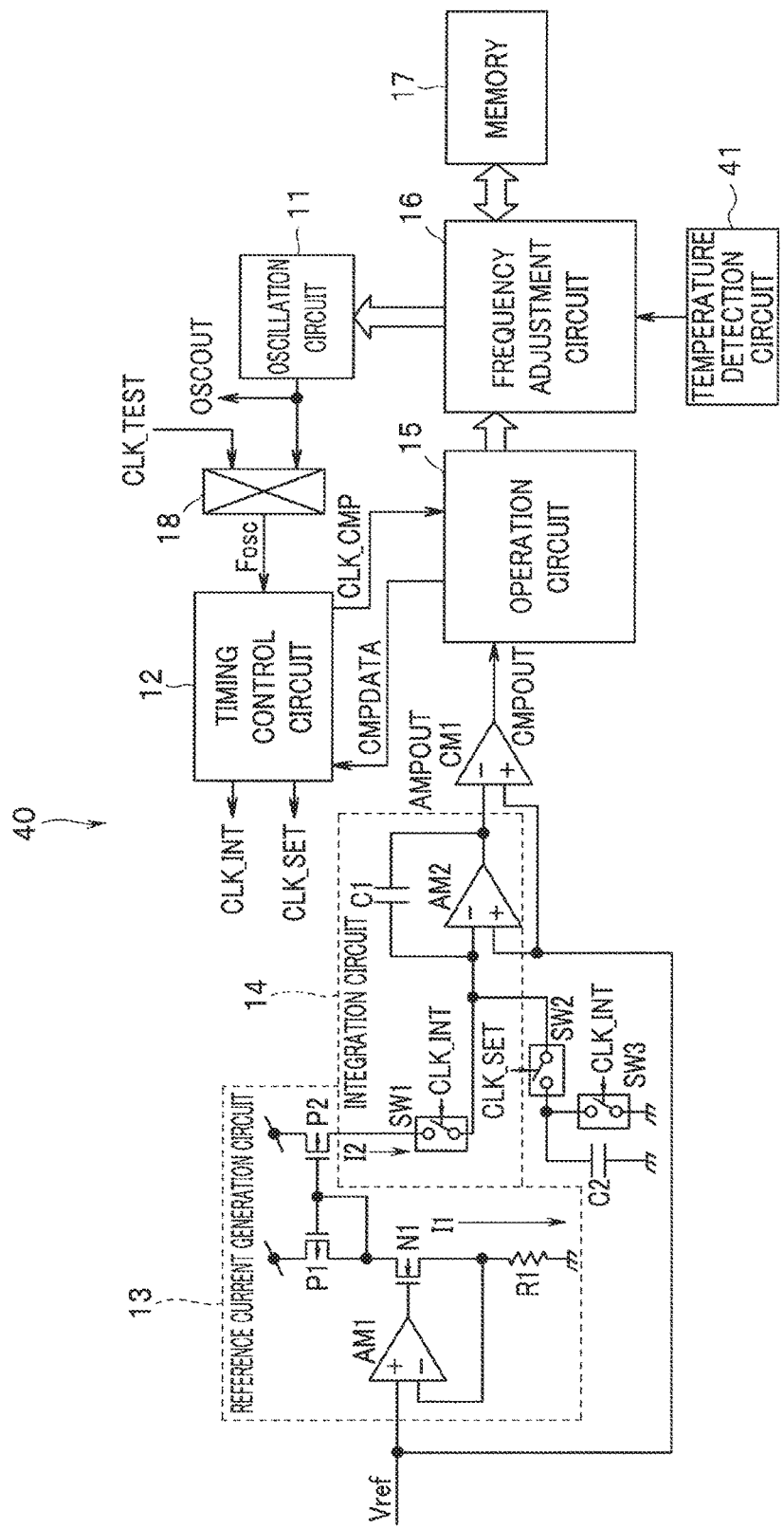
FIG. 8 is a block diagram showing a fifth embodiment.

FIG. 8 is a block diagram showing a fifth embodiment. In FIG. 8, same components as in FIG. 5 are given same reference numerals, and description of the components will be omitted. An oscillation apparatus 40 in the embodiment adopts a temperature detection circuit 41.

It is conceivable that a current value of the reference current I2 generated by the reference current generation circuit 13 may be fluctuated by temperature dependent characteristics of the resistance R1. Therefore, in the embodiment, a moving average value of the operation circuit 15 determined at each temperature is used as a reference value to be stored into the memory 17 with use of the test signal CLK_TEST. That is, in the memory 17, the moving average value for each temperature is stored in association with the temperature.

The temperature detection circuit 41 is configured with a temperature sensor or the like and adapted to detect an ambient temperature and output a detection result to the frequency adjustment circuit 16. The frequency adjustment circuit 16 is adapted to, in actual use, read out a reference value corresponding to a detected temperature based on a temperature detection result, and generate a control signal to control oscillation output of the oscillation circuit 11 based on a moving average value from the operation circuit 15 and the read-out reference value.

In the embodiment configured as described above, the reference current I2 generated by the reference current generation circuit 31 fluctuates due to influence of the temperature characteristics of the resistance R1. At shipment or the like, the selector 18 is caused to select the test signal CLK_TEST, and a moving average value is determined by the operation circuit 15. The moving average value is given to the memory 17 as a reference value and caused to be stored. In this case, the ambient temperature is caused to change by some method, and a moving average value determined for each temperature is caused to be stored into the memory 17 as a reference value corresponding to each temperature.

In actual use, the selector 18 selects the oscillation output OSCOUT from the oscillation circuit 11 and supplies the oscillation output OSCOUT to the timing control circuit 12 as the oscillation clock Fosc. The operation circuit 15 determines a moving average value and outputs the moving average value to the frequency adjustment circuit 16. In the embodiment, the temperature detection circuit 41 detects an ambient temperature and outputs a detection result to the frequency adjustment circuit 16. At the time of reading out a reference value from the memory 17, the frequency adjustment circuit 16 reads out a reference value corresponding to the detected temperature. The frequency adjustment circuit 16 compares a moving average value from the operation circuit 15 with the reference value read out from the memory 17 and generates a control signal to control the oscillation circuit 11.

In this case, the frequency adjustment circuit 16 uses a reference value determined for the ambient temperature, and it is possible to control the oscillation output OSCOUT to be a desired oscillation frequency irrespective of the temperature characteristics of the resistance R1.

Other operations and effects are similar to those of each of the above embodiments. In the embodiment, it is possible to obtain high-accuracy oscillation output irrespective of change in an ambient temperature.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An oscillation apparatus comprising:
   an oscillation circuit;
   a timing control circuit configured to generate a timing signal using an output clock of the oscillation circuit;
   an integration circuit configured to cyclically integrate a reference current based on the timing signal to output an output voltage value;
   a comparison circuit configured to compare the output voltage value of the integration circuit with predetermined threshold voltage and output a comparison result;
   a steady voltage changing circuit configured to, when it is shown by the at least one comparison result of the comparison circuit that the output voltage value of the integration circuit exceeds the threshold voltage, return the output voltage value of the integration circuit by a predetermined amount; and
   a frequency adjustment circuit configured to generate a control signal for adjusting an oscillation frequency of the oscillation circuit based on a value obtained by averaging the comparison result in plurality of the comparison circuit.

2. The oscillation apparatus according to claim 1, wherein the oscillation circuit is frequency-adjustable.

3. The oscillation apparatus according to claim 1, comprising a memory configured to store a reference value, wherein
   the frequency adjustment circuit generates the control signal for adjusting the oscillation frequency of the oscillation circuit by comparing the value obtained by averaging the comparison results of the comparison circuit with the reference value.

4. The oscillation apparatus according to claim 3, comprising a selector configured to switch between the output clock of the oscillation circuit and a test signal and give the output clock or the test signal to the timing control circuit, wherein
   when the test signal is supplied to the timing control circuit by the selector, the memory stores the value obtained by averaging the comparison results obtained from the comparison circuit as the reference value.

5. The oscillation apparatus according to claim 1, wherein the frequency adjustment circuit uses a moving average value of sampling results obtained by sampling the comparison results of the comparison circuit as the value obtained by averaging the comparison results of the comparison circuit.

6. The oscillation apparatus according to claim 1, comprising a reference current generation circuit configured to generate the reference current based on reference voltage and a reference resistance.

7. The oscillation apparatus according to claim 6, wherein the reference resistance is an external part.

8. The oscillation apparatus according to claim 1, wherein the integration circuit comprises a first switch configured to cyclically cause the reference current to flow only during a first period based on the timing signal, a first capacitor configured to be charged with the reference current flowing via the first switch, and an amplifier configured so that the first capacitor is connected between an inverting input terminal and an output terminal, and a fixed potential is applied to a non-inverting input terminal; and
   the steady voltage changing circuit comprises a second capacitor, and a second switch configured to connect the second capacitor between the inverting input terminal of the amplifier and a reference potential point only during a second period different from the first period based on the timing signal.

9. The oscillation apparatus according to claim 8, wherein the steady voltage changing circuit further comprises a third switch connected in parallel with the second capacitor, and the third switch is controlled in synchronization with the first switch.

10. The oscillation apparatus according to claim 1, wherein the oscillation circuit is a digital control oscillator constituting a digital PLL circuit.

11. The oscillation apparatus according to claim 10, wherein oscillation output of the digital control oscillator is controlled based on a control signal from a logic control circuit constituting the digital PLL circuit and the control signal from the frequency adjustment circuit.

12. The oscillation apparatus according to claim 1, comprising a temperature detection circuit configured to detect an ambient temperature, wherein the memory stores a plurality of reference values corresponding to ambient temperatures; and the frequency adjustment circuit determines a reference value used for comparison based on an ambient temperature detection result.

13. An oscillation frequency adjustment method comprising:

generating a timing signal for setting a first period corresponding to an output clock cycle of an oscillation circuit;

cyclically integrating a reference current only during the first period based on the timing signal to cause an output voltage value of an integration circuit to change;

comparing the output voltage value of the integration circuit with predetermined threshold voltage and outputting a comparison result at a predetermined cycle;

when it is shown by the comparison result that the output voltage value of the integration circuit exceeds the threshold voltage, returning the output voltage value of the integration circuit by a predetermined amount during a period other than the first period;

determining a value obtained by averaging the comparison result in plurality;

determining a difference between a reference value which is a possible value as the value obtained by averaging the comparison results when the oscillation circuit oscillates at an expected oscillation frequency and the value obtained by averaging the comparison results; and adjusting an oscillation frequency of the oscillation circuit based on the difference.

* * * * *